US010110998B2

(12) United States Patent
Peeler et al.

(10) Patent No.: US 10,110,998 B2
(45) Date of Patent: Oct. 23, 2018

(54) SYSTEMS AND METHODS FOR ADAPTIVE TUNING BASED ON ADJUSTABLE ENCLOSURE VOLUMES

(71) Applicant: Dell Products L.P., Round Rock, TX (US)

(72) Inventors: Douglas J. Peeler, Austin, TX (US); Adie O. Tan, Austin, TX (US); Timothy M. Radloff, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 52 days.

(21) Appl. No.: 15/339,329

(22) Filed: Oct. 31, 2016

(65) Prior Publication Data

US 2018/0124514 A1 May 3, 2018

(51) Int. Cl.

| | |
|---|---|
| ***H03G 3/00*** | (2006.01) |
| ***H04R 1/02*** | (2006.01) |
| ***H04R 9/06*** | (2006.01) |
| ***H04R 3/04*** | (2006.01) |
| ***H04R 29/00*** | (2006.01) |

(52) U.S. Cl.

CPC ............. *H04R 3/04* (2013.01); *H04R 29/001* (2013.01); *H04R 2499/15* (2013.01)

(58) Field of Classification Search

CPC ..... H04R 2499/15; H04R 29/001; H04R 3/04
USPC ...... 381/58, 59, 300, 303, 304, 305, 345, 95
See application file for complete search history.

(56) References Cited

U.S. PATENT DOCUMENTS

| | | | | |
|---|---|---|---|---|
| 5,638,439 A * | 6/1997 | Kawada | H04B 3/23 | 370/290 |
| 9,864,567 B2 * | 1/2018 | Seo | G06F 3/162 | |
| 2003/0202667 A1 * | 10/2003 | Sekine | G10H 1/0091 | 381/63 |
| 2004/0013278 A1 * | 1/2004 | Yamada | H04S 7/304 | 381/309 |
| 2005/0111750 A1 * | 5/2005 | Shan | G09G 5/00 | 382/274 |
| 2006/0125786 A1 * | 6/2006 | Genz | G01C 21/20 | 345/156 |
| 2006/0262938 A1 * | 11/2006 | Gauger, Jr. | G10L 21/02 | 381/56 |
| 2008/0297282 A1 * | 12/2008 | Larson | H01L 41/107 | 333/195 |
| 2009/0209293 A1 * | 8/2009 | Louch | H04M 1/6041 | 455/566 |
| 2010/0208908 A1 * | 8/2010 | Hoshuyama | H04B 3/23 | 381/66 |

(Continued)

*Primary Examiner* — Khai N Nguyen
(74) *Attorney, Agent, or Firm* — Jackson Walker L.L.P.

(57) ABSTRACT

In accordance with embodiments of the present disclosure, a system may include an audio input for receiving an audio input signal for reproduction at a speaker, a sensor input for receiving at least one sensor signal indicative of a physical quantity indicative of a variable acoustic volume to which an acoustic output of a speaker generates sound, wherein the acoustic volume is partially enclosed by structural members of an information handling system comprising the speaker, an output for generating an audio output signal to the speaker, and a processor configured to apply an adaptive audio response to the audio input signal to generate the audio output signal, wherein the adaptive audio response is a function of the physical quantity.

20 Claims, 5 Drawing Sheets

(56) References Cited

U.S. PATENT DOCUMENTS

| | | | | |
|---|---|---|---|---|
| 2010/0210327 | A1* | 8/2010 | Kim | H04M 1/035 455/575.3 |
| 2012/0231849 | A1* | 9/2012 | Yamashita | H04M 1/0245 455/566 |
| 2014/0126753 | A1* | 5/2014 | Takumai | H04S 7/305 381/303 |
| 2014/0133677 | A1* | 5/2014 | Zerbini | H04R 19/005 381/119 |
| 2014/0157125 | A1* | 6/2014 | Seo | G06F 3/0488 715/716 |
| 2014/0210740 | A1* | 7/2014 | Lee | G06F 3/0488 345/173 |
| 2014/0307888 | A1* | 10/2014 | Alderson | H04R 3/002 381/71.8 |
| 2015/0341712 | A1* | 11/2015 | Wilcox | H04R 7/045 381/332 |
| 2015/0373440 | A1* | 12/2015 | Fontana | H04R 1/025 381/388 |
| 2016/0219137 | A1* | 7/2016 | Louch | H04M 1/6041 |
| 2017/0299425 | A1* | 10/2017 | Barjatia | G01H 7/00 |

* cited by examiner

SYSTEMS AND METHODS FOR ADAPTIVE TUNING BASED ON ADJUSTABLE ENCLOSURE VOLUMES

TECHNICAL FIELD

The present disclosure relates in general to information handling systems, and more particularly to adaptation of acoustic tuning parameters for an acoustic transducer based on an adjustable acoustic enclosure volume.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In recent years, tablets and convertible notebooks (e.g., notebook or laptop information handling systems which are convertible to a tablet mode) have become increasingly popular. Over time, the thin form factors associated with tablets and convertible notebooks have gotten increasingly thinner. Such decreasing form factor sizes have often made it increasingly difficult to provide devices with desirable audio performance. For instance, low-frequency sounds or "bass" has been increasingly difficult to produce as low frequencies often require larger acoustic volumes in which such low-frequency sounds may resonate.

SUMMARY

In accordance with the teachings of the present disclosure, one or more disadvantages and problems associated with performance of audio transducers in an information handling system may be reduced or eliminated.

In accordance with embodiments of the present disclosure, a method for audio processing may include determining a physical quantity indicative of a variable acoustic volume to which an acoustic output of a speaker generates sound, wherein the acoustic volume is partially enclosed by structural members of an information handling system comprising the speaker and applying an adaptive audio response to an audio input signal to generate an audio output signal, wherein the adaptive audio response is a function of the physical quantity.

In accordance with these and other embodiments of the present disclosure, a system may include an audio input for receiving an audio input signal for reproduction at a speaker, a sensor input for receiving at least one sensor signal indicative of a physical quantity indicative of a variable acoustic volume to which an acoustic output of a speaker generates sound, wherein the acoustic volume is partially enclosed by structural members of an information handling system comprising the speaker, an output for generating an audio output signal to the speaker, and a processor configured to apply an adaptive audio response to the audio input signal to generate the audio output signal, wherein the adaptive audio response is a function of the physical quantity.

In accordance with these and other embodiments of the present disclosure, an article of manufacture may include a non-transitory computer readable medium and computer-executable instructions carried on the computer readable medium, the instructions readable by a processor. The instructions, when read and executed, may cause the processor to determine a physical quantity indicative of a variable acoustic volume to which an acoustic output of a speaker generates sound, wherein the acoustic volume is partially enclosed by structural members of an information handling system comprising the speaker and apply an adaptive audio response to an audio input signal to generate an audio output signal, wherein the adaptive audio response is a function of the physical quantity.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
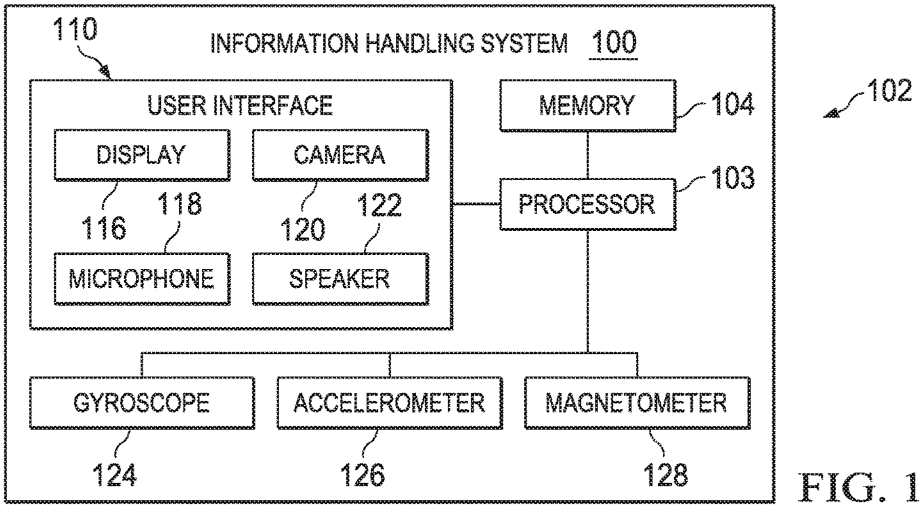
FIG. 1 illustrates a block diagram of an example information handling system, in accordance with certain embodiments of the present disclosure.

Preferred embodiments and their advantages are best understood by reference to FIGS. 1-6, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

For the purposes of this disclosure, the terms "wireless transmissions" and "wireless communication" may be used to refer to all types of electromagnetic communications which do not require a wire, cable, or other types of conduits. Examples of wireless transmissions which may be used include, but are not limited to, short-range wireless communication technologies (e.g., proximity card, Radio-Frequency Identification (RFID), Near Field Communication (NFC), Bluetooth, ISO 14443, ISO 15693, or other suitable standard), personal area networks (PAN) (e.g., Bluetooth), local area networks (LAN), wide area networks (WAN), narrowband personal communications services (PCS), mobile telephony technologies, broadband PCS, circuit-switched cellular, cellular digital packet data (CDPD), and radio frequencies, such as the 800 MHz, 900 MHz, 1.9 GHz and 2.4 GHz bands, infra-red and laser.

FIG. 1 illustrates a block diagram of an example information handling system 102. In some embodiments, information handling system 102 may be a personal computer (e.g., a desktop computer, a laptop, notebook, tablet, handheld, smart phone, personal digital assistant, etc.). As depicted in FIG. 1, information handling system 102 may include an enclosure 100 housing a plurality of information handling resources including, without limitation, a processor 103, a memory 104 communicatively coupled to processor 103, a user interface 110 communicatively coupled to processor 103, and a plurality of sensors coupled to a sensor controller 103, wherein such sensors may include one or more of a gyroscope 124, an accelerometer 126, and a magnetometer 128.

Enclosure 100 may include any structure or aggregation of structures that serves as a container for one or more information handling systems and information handling resources, and may be constructed from steel, aluminum, plastic, and/or any other suitable material. Although the term "enclosure" is used, enclosure 100 may also be referred to as a case, cabinet, tower, box, chassis, and/or housing. In some embodiments, chassis 100 may be configured to hold and/or provide power to a plurality of information handling resources.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may include any system, device, or apparatus configured to retain program instructions and/or data for a period of time (e.g., computer-readable media). Memory 104 may include RAM, EEPROM, a PCMCIA card, flash memory, magnetic storage, opto-magnetic storage, or any suitable selection and/or array of volatile or non-volatile memory that retains data after power to information handling system 102 is turned off.

User interface 110 may comprise any instrumentality or aggregation of instrumentalities by which a user may interact with information handling system 102. For example, user interface 110 may permit a user to input data and/or instructions into information handling system 102 (e.g., via a keypad, keyboard, touch screen, microphone, camera, and/or other data input device), and/or otherwise manipulate information handling system 102 and its associated components. User interface 110 may also permit information handling system 102 to communicate data to a user (e.g., via a display device, speaker, and/or other data output device). As shown in FIG. 1, user interface 110 may include one or more of a display 116, microphone 118, camera 120, and speaker 122.

A display 116 may comprise any suitable system, device, or apparatus configured to display human-perceptible graphical data and/or alphanumeric data to a user. For example, in some embodiments, display 116 may comprise a liquid crystal display.

A microphone 118 may comprise any system, device, or apparatus configured to convert sound incident at microphone 118 to an electrical signal that may be processed by processor 103. In some embodiments, microphone 118 may include a capacitive microphone (e.g., an electrostatic microphone, a condenser microphone, an electret microphone, a microelectromechanical systems (MEMs) microphone, etc.) wherein such sound is converted to an electrical signal using a diaphragm or membrane having an electrical capacitance that varies based on sonic vibrations received at the diaphragm or membrane.

A camera 120 may comprise any system, device, or apparatus configured to record images (moving or still) into one or more electrical signals that may be processed by processor 103.

A speaker 122 may comprise any system, device, or apparatus configured to produce sound in response to electrical audio signal input. In some embodiments, a speaker 122 may comprise a dynamic loudspeaker, which employs a lightweight diaphragm mechanically coupled to a rigid frame via a flexible suspension that constrains a voice coil to move axially through a cylindrical magnetic gap such that when an electrical signal is applied to the voice coil, a magnetic field is created by the electric current in the voice coil, making it a variable electromagnet. The coil and the driver's magnetic system interact, generating a mechanical force that causes the coil (and thus, the attached cone) to move back and forth, thereby reproducing sound under the control of the applied electrical signal coming from the amplifier.

Gyroscope 124 may be communicatively coupled to processor 103, and may include any system, device, or apparatus configured to measure an orientation of information handling system 102 (e.g., based on an angular momentum experienced by information handling system 102).

Accelerometer 126 may be communicatively coupled to processor 103, and may include any system, device, or apparatus configured to measure acceleration (e.g., proper acceleration) experienced by information handling system 102. Accordingly, accelerometer 126 may measure a gravitational orientation of information handling system 102.

Magnetometer 128 may be communicatively coupled to processor 103, and may include any system, device, or apparatus configured to measure the strength and/or direction of a magnetic field (e.g., the Earth's magnetic field). Accordingly, magnetometer 128 may operate as a compass to determine geographical location.

In addition to processor 103, memory 104, user interface 110, gyroscope 124, accelerometer 126, and magnetometer 128, information handling system 102 may include one or more other information handling resources, including one or more other sensors.

Figure 2:
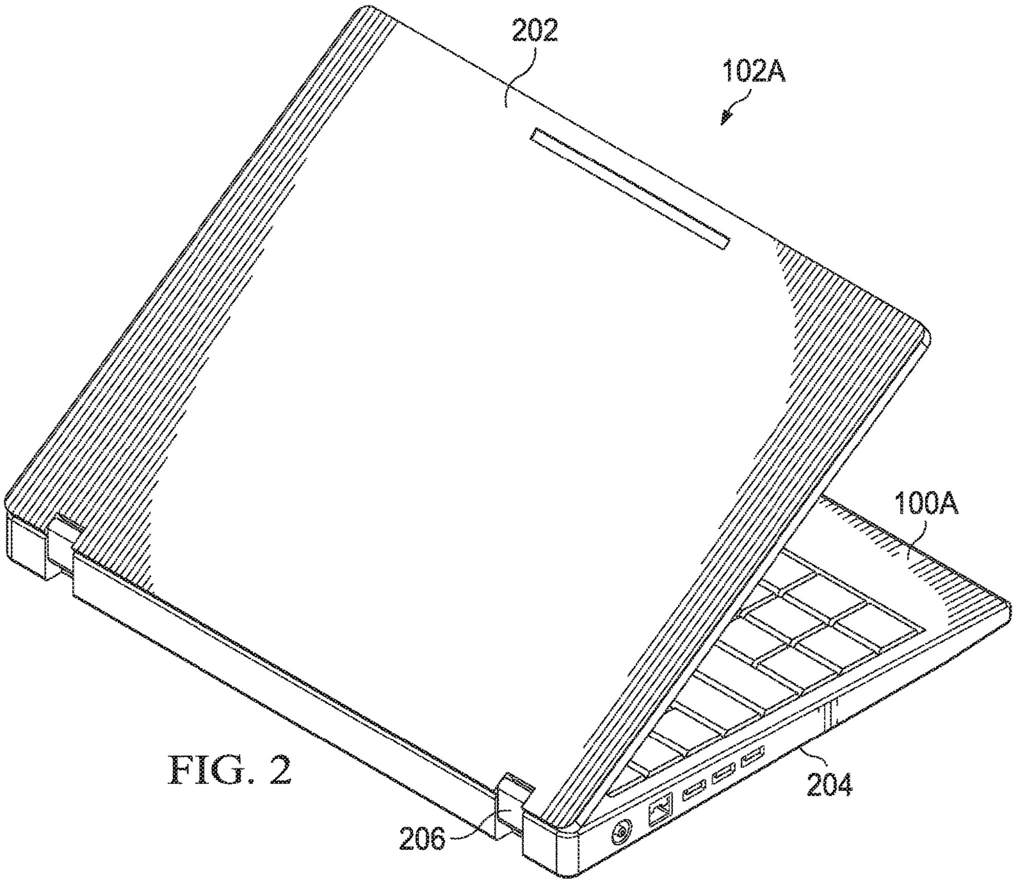
FIG. 2 illustrates an exterior view of an example information handling system embodied as a notebook or laptop computer, in accordance with embodiments of the present disclosure.

FIG. 2 illustrates an exterior view of example information handling system 102A embodied as a notebook or laptop computer, in accordance with embodiments of the present disclosure. As depicted in FIG. 2, information handling system 102A may include a display assembly 202 (which may house display 116 and/or other information handling resources) and a keyboard assembly 204 (which may house a keyboard, pointing device, and/or other information handling resources) hingedly coupled via one or more hinges 206. Each of display assembly 202 and keyboard assembly 204 may be integral parts of an enclosure 100A for information handling system 102A. Each of display assembly 202 and keyboard assembly 204 may have an enclosure made from one or more suitable materials, including without limitation plastic, steel, and/or aluminum. Although information handling system 102A is shown in FIG. 2 as having certain components (e.g., display assembly 202, keyboard assembly 204, and hinge 206), information handling system 102A may include any other suitable components which may not have been depicted in FIG. 2 for the purposes of clarity and exposition. In operation, information handling system 102A may be translated between a closed position (e.g., a position of display assembly 202 relative to keyboard assembly 204 such that display assembly 202 substantially overlays keyboard assembly 204, or vice versa) and an open position (e.g., a position of display assembly 202 relative to keyboard assembly 204 such that display assembly 202 does not substantially overlay keyboard assembly 204, or vice versa, such as when the angle formed by display assembly 202 and keyboard assembly 204 at hinge 206 is substantially non-zero). In some embodiments, a user may be able to open information handling system 102A into a tablet mode, by rotating display assembly 202 relative to keyboard assembly 204 beyond an angle of 180 degrees relative to the closed position, as shown in greater detail in FIGS. 4A-4D, below.

Figure 3B:
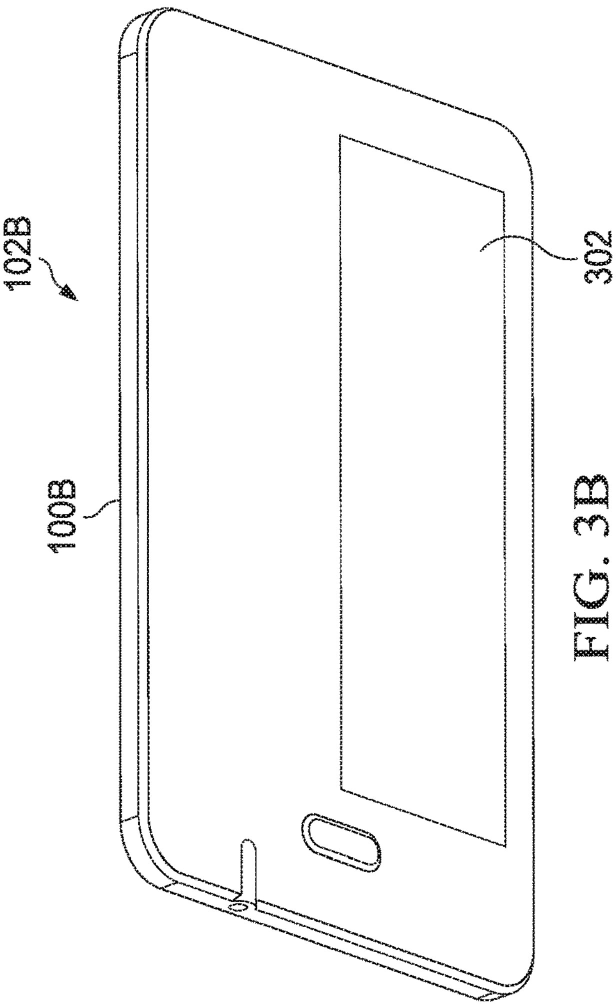
FIGS. 3A and 3B illustrate an exterior view of an example information handling system embodied as a mobile device, in accordance with embodiments of the present disclosure.
Figure 3A:
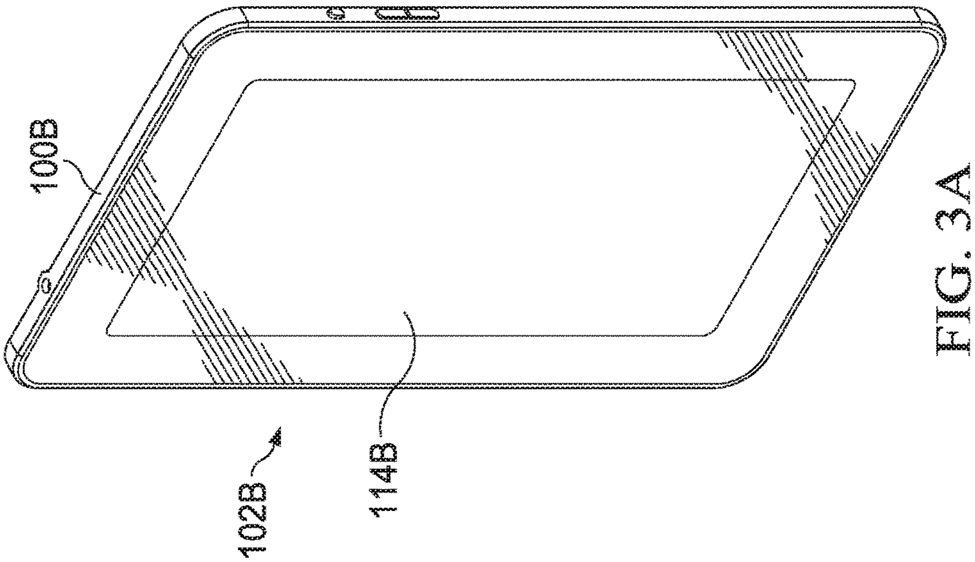
Figure 4A:
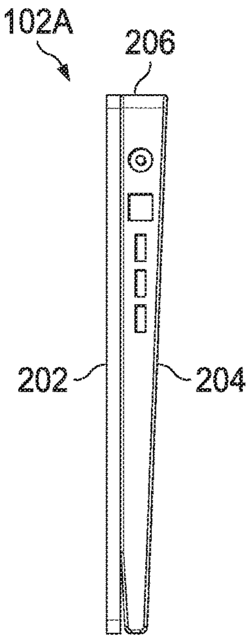
FIGS. 4A-4D illustrate views of the example information handling system of FIG. 2 in various orientations of a tablet mode, in accordance with embodiments of the present disclosure.
Figure 4B:
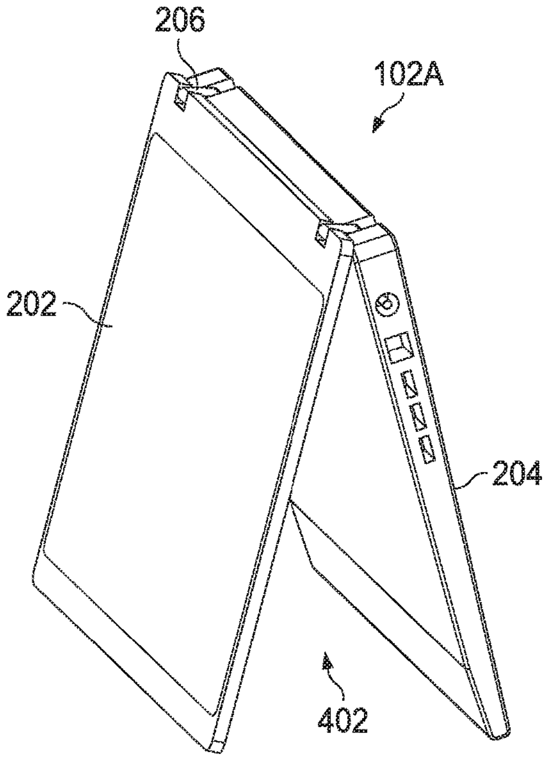
Figure 4C:
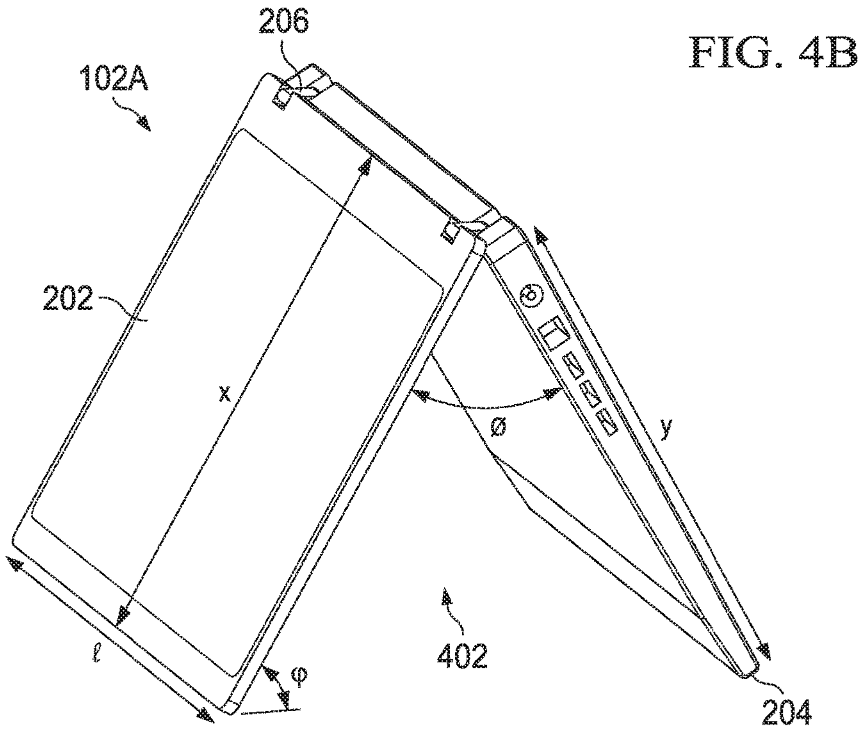
Figure 4D:
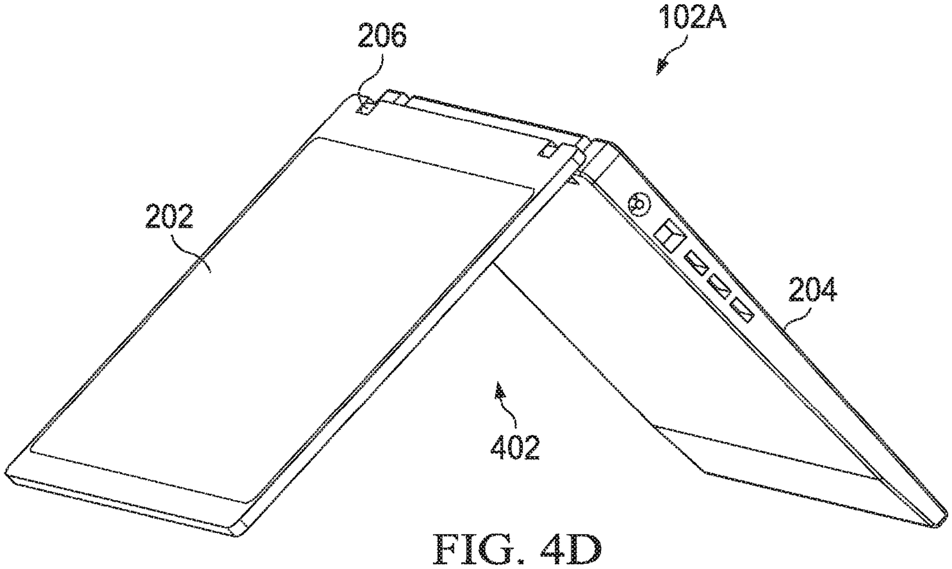

FIGS. 3A and 3B illustrate an exterior view of an example information handling system 102B embodied as a mobile device sized and shaped to be readily transportable on the person of a user (e.g., a mobile phone, tablet, personal digital assistant, digital music player, etc.), in accordance with embodiments of the present disclosure. As shown in FIGS. 3A and 3B, a front (FIG. 3A) of example information handling system 102B may include on the surface thereof a display 116B communicatively coupled to other information handling resources housed within enclosure 100B. In such embodiments, display 114B may include a touch sensor. As known in the art, such a touch sensor may include a system, device, or apparatus configured to detect tactile touches (e.g., by a human finger, a stylus, etc.) on the touch sensor and generate one or more signals indicative of the occurrence of such touches and/or the locations of such touches on the touch sensor. For example, a touch sensor may be a capacitive touch sensor configured to detect changes in capacitance induced by tactile touches. In these and other embodiments, a touch sensor may be constructed from substantially optically transparent material and placed over a liquid crystal display or another display apparatus of display 116B, allowing a user to view graphical elements of display 116B while interacting with the touch sensor. In the embodiments shown in FIGS. 3A and 3B, a user may come in contact with many surfaces of enclosure 100B (e.g., the reverse of enclosure 100B shown in FIG. 3B which may rest in a user's hand during use) that may absorb heat generated by information handling resources of information handling system 102B.

As shown in FIG. 3B, enclosure 100B of example information handling system 102B may include a kickstand 302 hingedly coupled to the remainder of enclosure 100B such that as a surface of display 116B is positioned in a position which is not perpendicular to another surface on which information handling system 102B is placed (e.g. a table top), kickstand 302 may open to an open position in which an end of kickstand 302 opposite its hinged connection is significantly distanced from the remainder of enclosure 100B, as shown in greater detail below with respect to FIGS. 5A-5D.

Although FIGS. 2, 3A, and 3B depict information handling system 102A as a laptop or notebook computer and information handling system 102B as a mobile device sized and shaped to be readily transported and carried on a person of a user of information handling system 102B, an information handling system 102 may comprise any type of information handling system (e.g., a desktop computer, a tower computer, a server, storage enclosure, etc.), and methods and systems disclosed, described, and claimed herein may not be limited to application in a laptop or notebook computer or to a mobile device. In addition, although FIG. 3A depicts an information handing system 102B as including a touch sensor, it is noted that information handling systems other than tablets and smart phones may include a touch-screen display having a touch sensor.

FIGS. 4A-4D illustrate views of the example information handling system 102A in various orientations (e.g., clamshell, tent, tablet), in accordance with embodiments of the present disclosure. In each of the orientations depicted in FIGS. 4A-4D, display assembly 202 may be at an angle φ relative to a surface (e.g., table top) upon which information handling 102A rests and display assembly 202 may be at an angle ϕ relative to keyboard assembly 204 at hinge 206. Accordingly, for angles of ϕ greater than zero, display assembly 202 and keyboard assembly 204 may partially enclose an acoustic volume 402 in which sound generated by a speaker 122 may resonate. Such volume V may be given by:

$$V=xyl \sin \phi/2$$

in which x is a height of display assembly 202, y is a height of keyboard assembly 204, and l is a width of display assembly 202 (or keyboard assembly 204).

FIGS. 5A-5D illustrate views of the example information handling system of FIGS. 3A and 3B in various orientations, in accordance with embodiments of the present disclosure. In each of the orientations depicted in FIGS. 5A-5D, kickstand 302 may be at an angle ϕ relative to the remainder of enclosure 100B which itself may be an angle φ relative to a surface (e.g., table top) upon which information handling 102B is placed. Accordingly, for angles of φ greater than zero, kickstand 302 and the remainder of enclosure 100B may partially enclose an acoustic volume 502 in which sound generated by a speaker 122 may resonate. Such volume V may be given by:

$$V=xyl \sin \phi/2$$

in which y is a height of kickstand 302, x is a height of the remainder of enclosure 100B between the surface upon which it rests and the hinge coupling it to kickstand 302, and l is a width of enclosure 100B.

Figure 6:
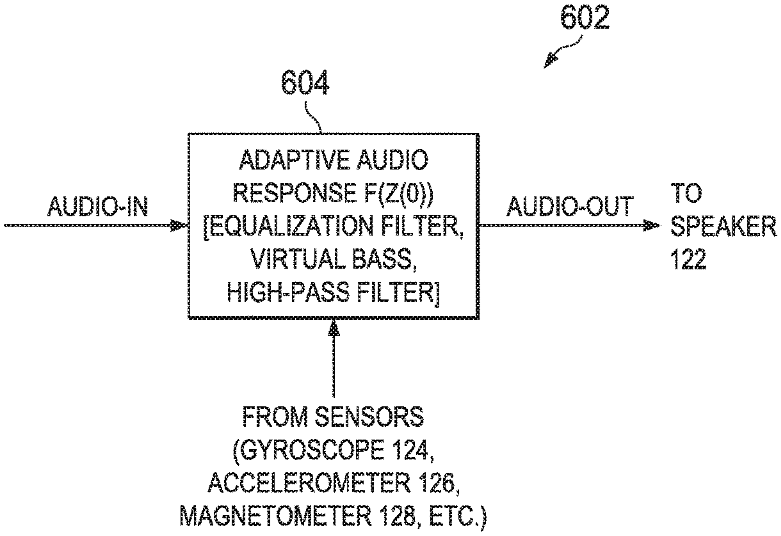
FIG. 6 illustrates a block diagram of an audio processing system that may be implemented by the processor of the information handling system depicted in FIG. 1, in accordance with embodiments of the present disclosure.
Figure 5C:
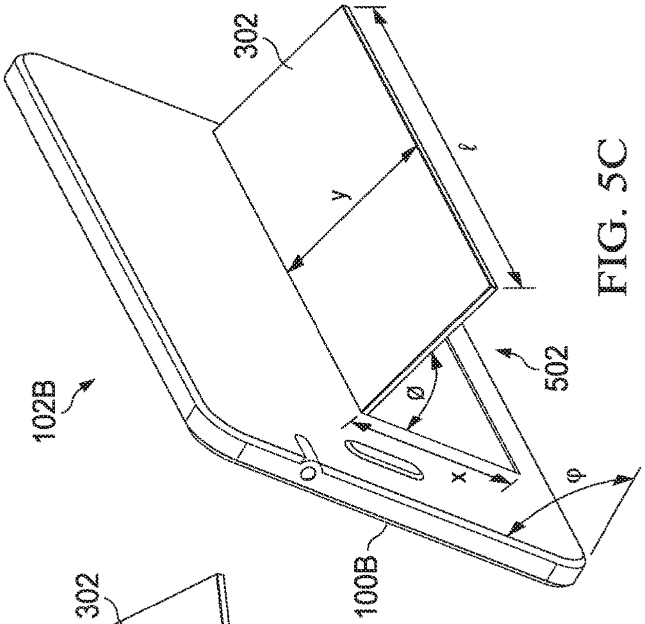
FIGS. 5A-5D illustrate views of the example information handling system of FIGS. 3A and 3B in various orientations, in accordance with embodiments of the present disclosure.
Figure 5B:
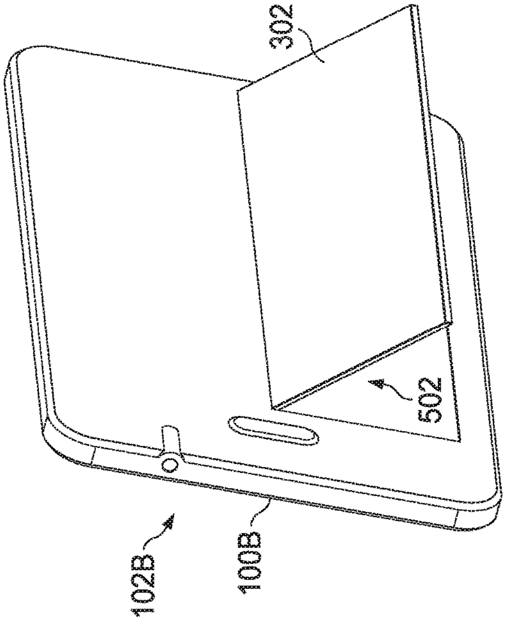
Figure 5A:
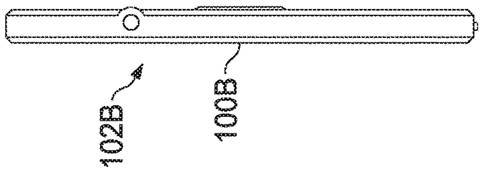
Figure 5D:
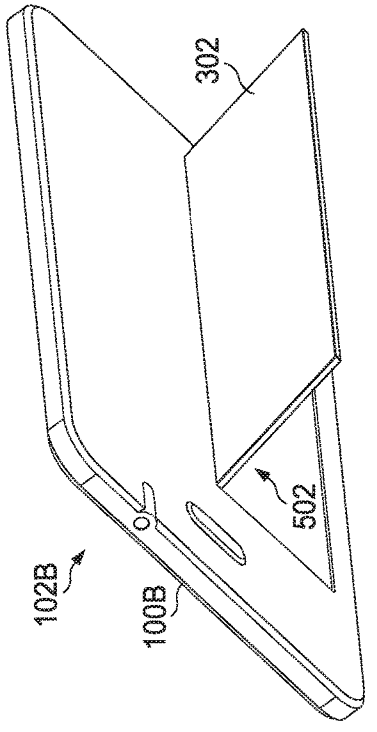

FIG. 6 illustrates a block diagram of an audio processing system 602 that may be implemented by processor 103 or another suitable component of information handling system 102, in accordance with embodiments of the present disclosure. As shown in FIG. 6, audio processing system 602 may include an adaptive audio response 604 which may apply to an input signal AUDIO_IN a response F(z) which is a function of angle ϕ in order to generate an audio output signal AUDIO_OUT (e.g., AUDIO_OUT=F(z)·AUDIO_IN) which may be output to speaker 122. The response F(z) may be adaptive, and may be a function of an acoustic volume (e.g., acoustic volume 402 or 502) to which speaker 122 outputs sound, wherein the acoustic volume itself may be a function of angle c (or another suitable angle) of the acoustic volume. Accordingly, the response F(z) may be a function of such angle ϕ.

Adaptive audio response 604 or another component (not shown) of audio processing system 602 may determine angle ϕ (or another suitable angle of an acoustic volume) based on information received from one or more sensors (e.g., gyroscope 124, accelerometer 126, and/or magnetometer 128) able to sense a position or orientation of information handling system 102.

Examples of adaptive audio response 604 may include an equalization filter, a virtual bass system which virtually or psychoacoustically adds lower-frequency components to an audio signal, high-pass filters, or any combination of the foregoing. Adaptive audio response 604 may adapt parameters of adaptive audio response F(z) (e.g., filter coefficients) based on an acoustic volume in order to generate a desired response.

For example, in some embodiments, adaptive audio response 604 may generate adaptive response F(z) such that a composite response of adaptive response F(z), a response G(z) of the electroacoustical path of the audio signal path to speaker 122, and a response H(z) of the acoustic volume is maintained to be approximately equal to some overall desired response. Or stated another way:

$$A(z)=F(z)\cdot G(z)\cdot H(z)$$

where A(z) equals a desired overall response of an audio system.

The conversion of an angle ϕ or acoustic volume into adaptive response F(z) may be accomplished in any suitable manner. For example, in some embodiments, adaptive audio response 604 may receive angle ϕ or an acoustic volume as an input to an equation, and generate response F(z) based on such equation. In other embodiments, adaptive audio response 604 may receive angle ϕ or an acoustic volume as an index to a look up table, wherein each entry of the look up table sets forth parameters of response F(z) (e.g., filter coefficients) associated with a plurality of angles. Accordingly, values of angle ϕ sensed by sensors and/or used by adaptive audio response 604 may be continuous or discrete values (e.g., nearest degree, nearest five degrees, etc.).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A method for audio processing, including:

determining a physical quantity indicative of a variable acoustic volume, wherein an acoustic output of a speaker is directed inwardly into the variable acoustic volume and configured to generate sound inside the variable acoustic volume, and wherein the variable acoustic volume is partially enclosed by structural members of an information handling system that comprises the speaker;

applying an adaptive audio response to an audio input signal to generate an audio output signal, wherein the adaptive audio response is a function of the physical quantity; and causing the speaker to generate sound inside the variable acoustic volume based on the audio input signal and the adaptive audio response.

2. The method of claim 1, wherein the physical quantity comprises an angle associated with the variable acoustic volume.

3. The method of claim 2, wherein the angle comprises an angle between a structural member of the information handling system and a surface upon which the information handling system rests.

4. The method of claim 2, wherein the angle comprises an angle between two structural members of the information handling system.

5. The method of claim 1, wherein determining the physical quantity comprises determining the physical quantity based on at least one sensor of the information handling system.

6. The method of claim 5, wherein the at least one sensor comprises a gyroscope, and/or an accelerometer, and/or a magnetometer.

7. The method of claim 1, further comprising generating the adaptive audio response based on the physical quantity such that an overall response of an audio signal path comprising the adaptive audio response, a response of an electroacoustical path through the speaker, and a response of the variable acoustic volume is approximately equal to a desired overall response.

8. A system comprising:

an audio input for receiving an audio input signal for reproduction at a speaker of an information handling system;

a sensor input for receiving at least one sensor signal indicative of a physical quantity indicative of a variable acoustic volume, wherein an acoustic output of the speaker is directed inwardly into the variable acoustic volume and configured to generate sound inside the variable acoustic volume, and wherein the variable acoustic volume is partially enclosed by structural members of the information handling system;

an output for generating an audio output signal to the speaker; and a processor configured to apply an adaptive audio response to the audio input signal to generate the audio output signal, wherein the adaptive audio response is a function of the physical quantity.

9. The system of claim 8, wherein the physical quantity comprises an angle associated with the variable acoustic volume.

10. The system of claim 9, wherein the angle comprises an angle between a structural member of the information handling system and a surface upon which the information handling system rests.

11. The system of claim 9, wherein the angle comprises an angle between two structural members of the information handling system.

12. The system of claim 8, wherein the at least one sensor signal comprises a signal from a gyroscope, and/or an accelerometer, and/or a magnetometer.

13. The system of claim 8, wherein the processor is further configured to generate the adaptive audio response based on the physical quantity such that an overall response of an audio signal path comprising the adaptive audio response, a response of an electroacoustical path through the speaker, and a response of the variable acoustic volume is approximately equal to a desired overall response.

14. An article of manufacture, comprising;

a non-transitory computer readable medium; and computer-executable instructions carried on the computer readable medium, the instructions readable by a processor, the instructions, when read and executed, for causing the processor to:

determine a physical quantity indicative of a variable acoustic volume, wherein an acoustic output of a speaker is directed inwardly into the variable acoustic volume and configured to generate sound inside the variable acoustic volume, and wherein the variable acoustic volume is partially enclosed by structural members of an information handling system that comprises the speaker;

apply an adaptive audio response to an audio input signal to generate an audio output signal, wherein the adaptive audio response is a function of the physical quantity; and cause the speaker to generate sound inside the variable acoustic volume based on the audio output signal.

15. The article of claim 14, wherein the physical quantity comprises an angle associated with the variable acoustic volume.

16. The article of claim 15, wherein the angle comprises an angle between a structural member of the information handling system and a surface upon which the information handling system rests.

17. The article of claim 15, wherein the angle comprises an angle between two structural members of the information handling system.

18. The article of claim 14, wherein determining the physical quantity comprises determining the physical quantity based on at least one sensor of the information handling system.

19. The article of claim 18, wherein the at least one sensor comprises a gyroscope, and/or an accelerometer, and/or a magnetometer.

20. The article of claim 14, the instructions for further causing the processor to generate the adaptive audio response based on the physical quantity such that an overall response of an audio signal path comprising the adaptive audio response, a response of an electroacoustical path through the speaker, and a response of the variable acoustic volume is approximately equal to a desired overall response.

* * * * *